United States Patent [19]

Baliga et al.

[11] Patent Number: 4,912,541
[45] Date of Patent: Mar. 27, 1990

[54] MONOLITHICALLY INTEGRATED BIDIRECTIONAL LATERAL SEMICONDUCTOR DEVICE WITH INSULATED GATE CONTROL IN BOTH DIRECTIONS AND METHOD OF FABRICATION

[75] Inventors: Bantval J. Baliga; Deva N. Pattanayak, both of Schenectady, N.Y.

[73] Assignee: General Electric Company, Schenectady, N.Y.

[21] Appl. No.: 51,422

[22] Filed: May 19, 1987

[51] Int. Cl.⁴ .................................................. H01L 29/74
[52] U.S. Cl. .................................... 357/38; 357/20; 357/23.4; 357/43; 357/86
[58] Field of Search ................... 357/20, 23.4, 38, 43, 357/86

[56] References Cited

U.S. PATENT DOCUMENTS 4,580,154  4/1986  Coe .................................... 357/23.4
4,604,638  8/1986  Matsuda ........................... 357/23.4

Primary Examiner—Joseph E. Clawson, Jr.
Attorney, Agent, or Firm—Robert Ochis; James C. Davis, Jr.; Marvin Snyder

[57] ABSTRACT

A monolithically integrated reverse conducting lateral insulated gate semiconductor device includes an inherent four layer structure which supplies a sufficient base drive to turn on an inherent lateral transistor under forward bias conditions. Under reverse bias conditions, an inherent five layer structure is activated to provide for high current density low voltage reverse conduction in the device. Forward and reverse current flow can be interrupted by the application of an appropriate bias to the same insulated gate electrode. The disclosed semiconductor device achieves improved current density and concomitantly reduced cell size.

13 Claims, 12 Drawing Sheets

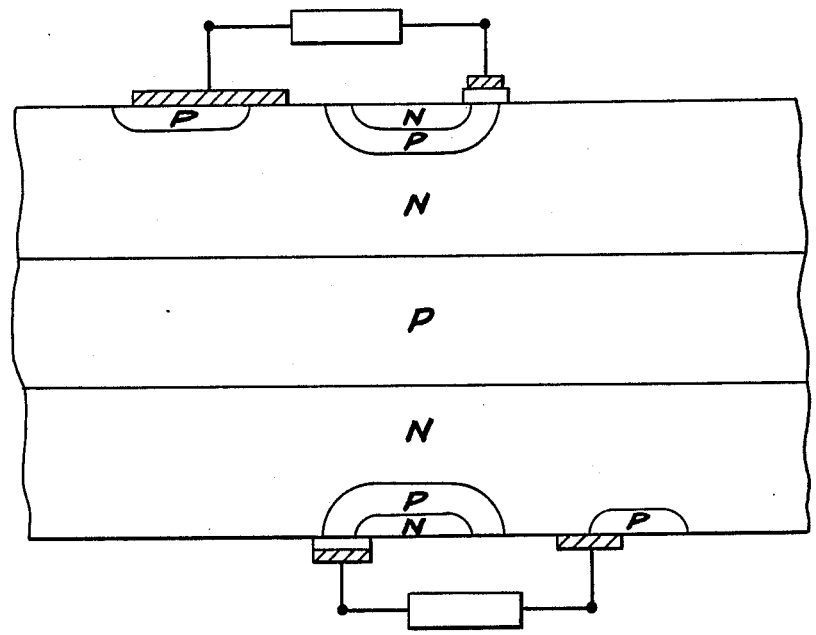
FIG. 1 CONVENTIONAL DEVICE
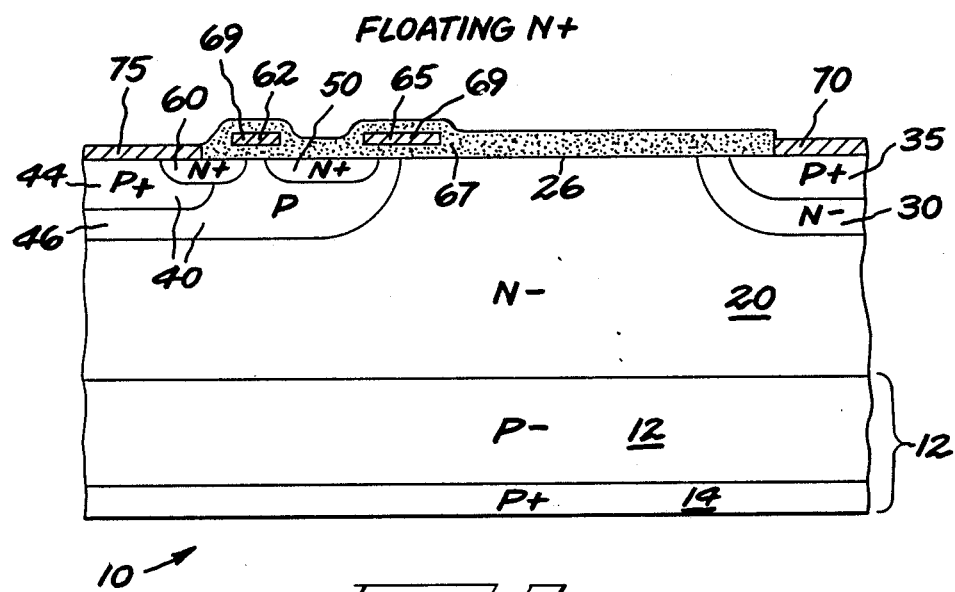
FIG. 2

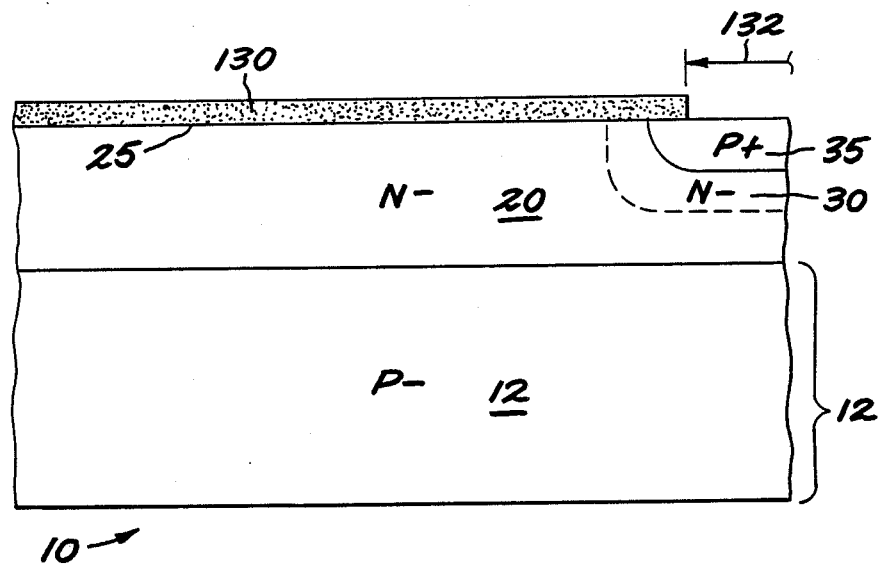
FIG. 5B A-A
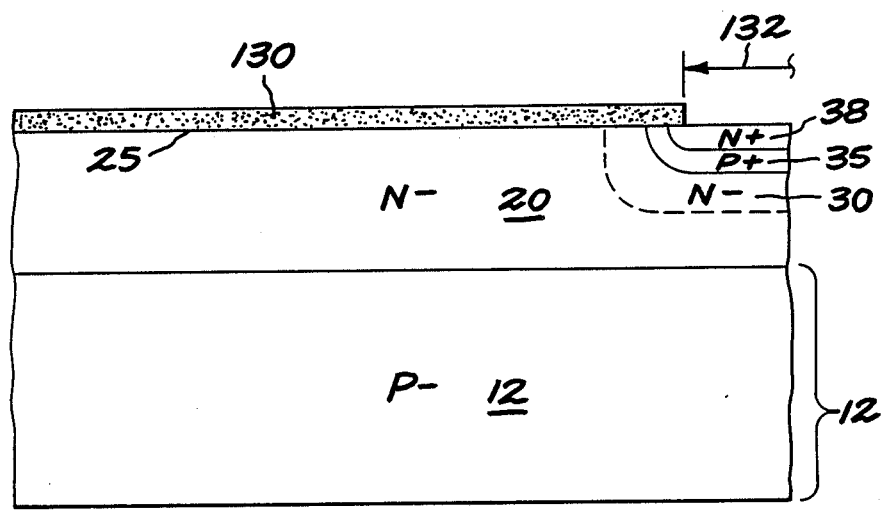
FIG. 5B B-B

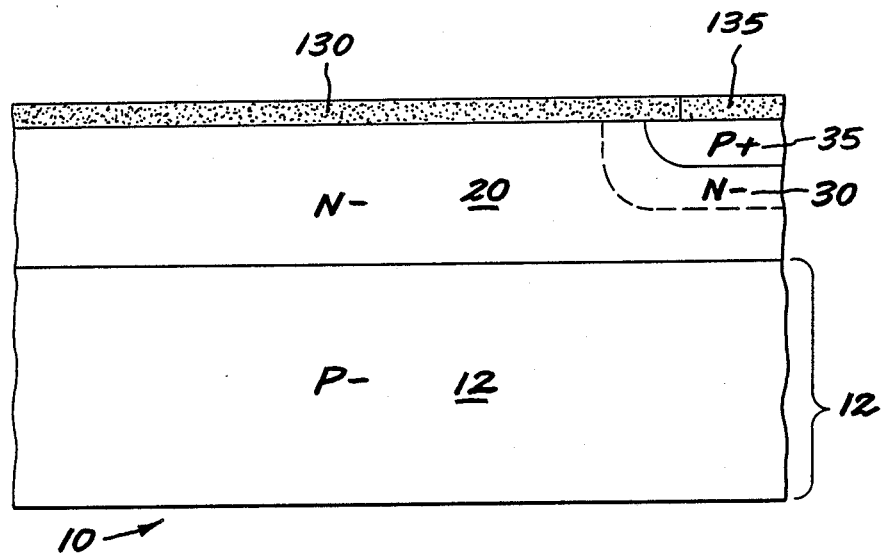
FIG. 5C A-A
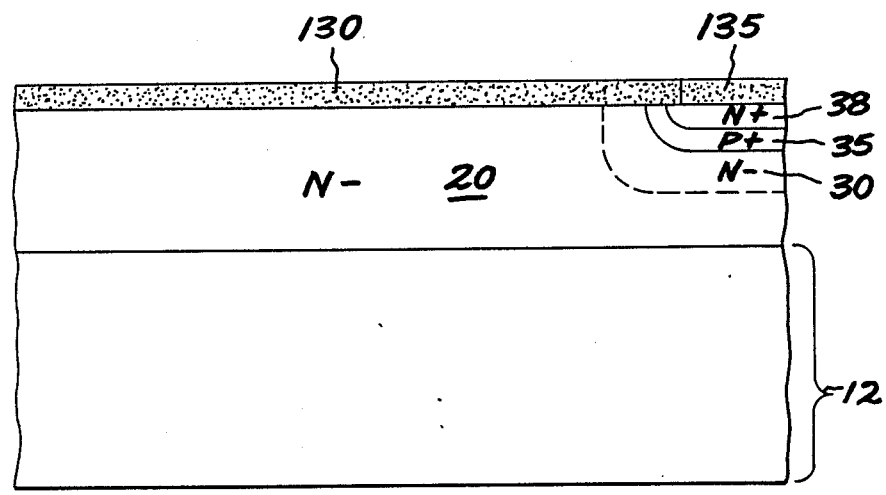
FIG. 5C B-B

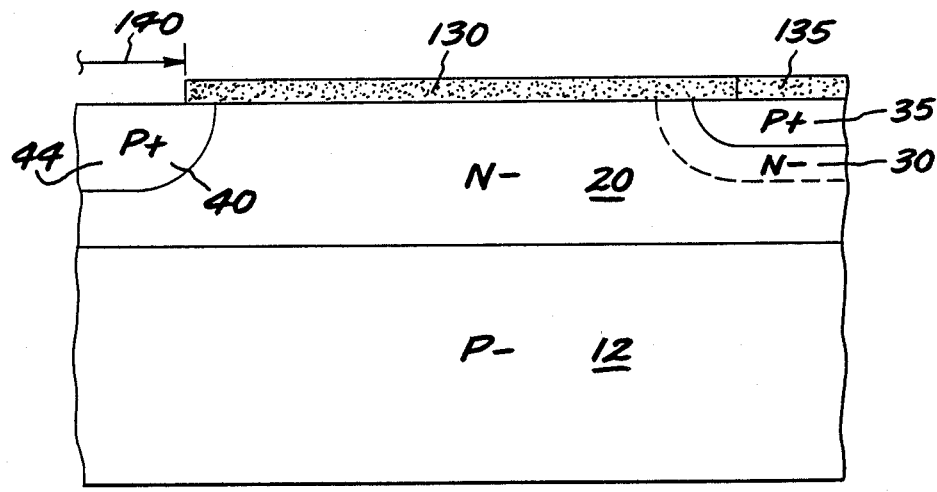
FIG. 5D A-A
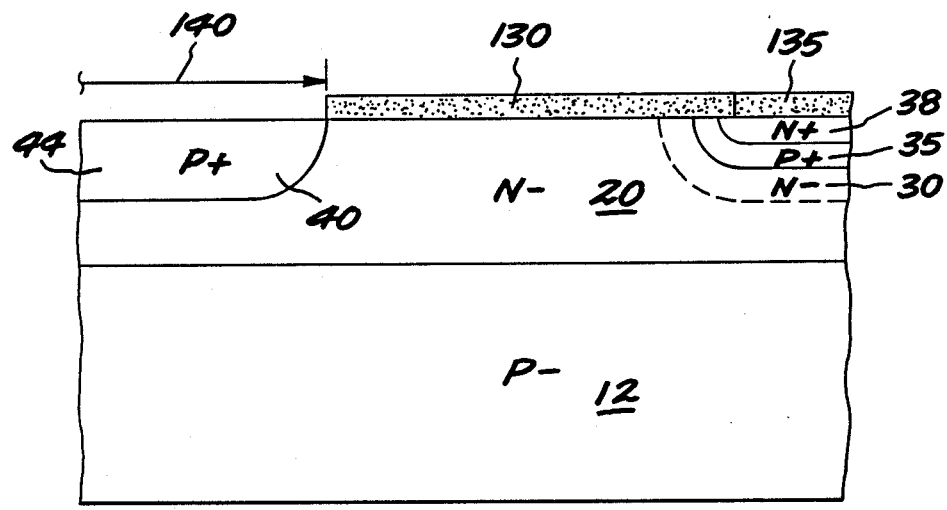
FIG. 5D B-B

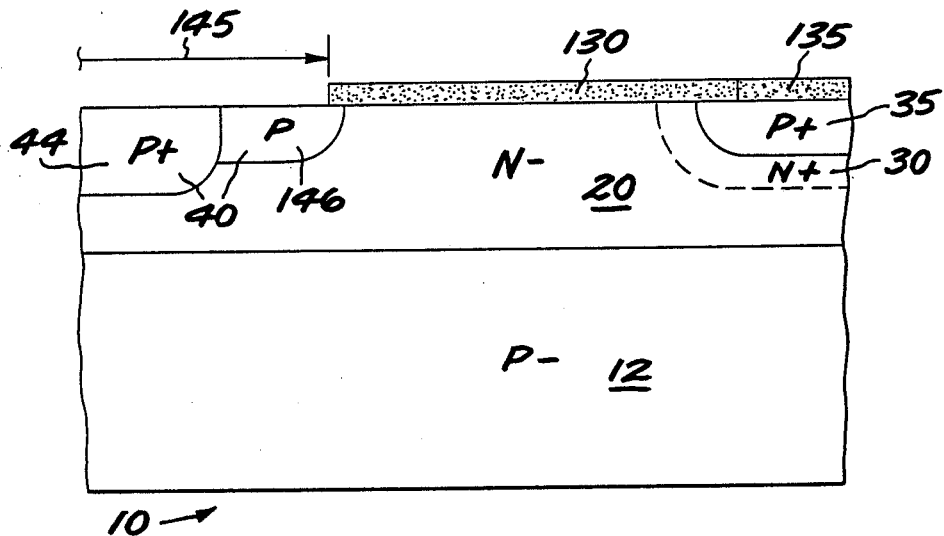
FIG. 5E A-A
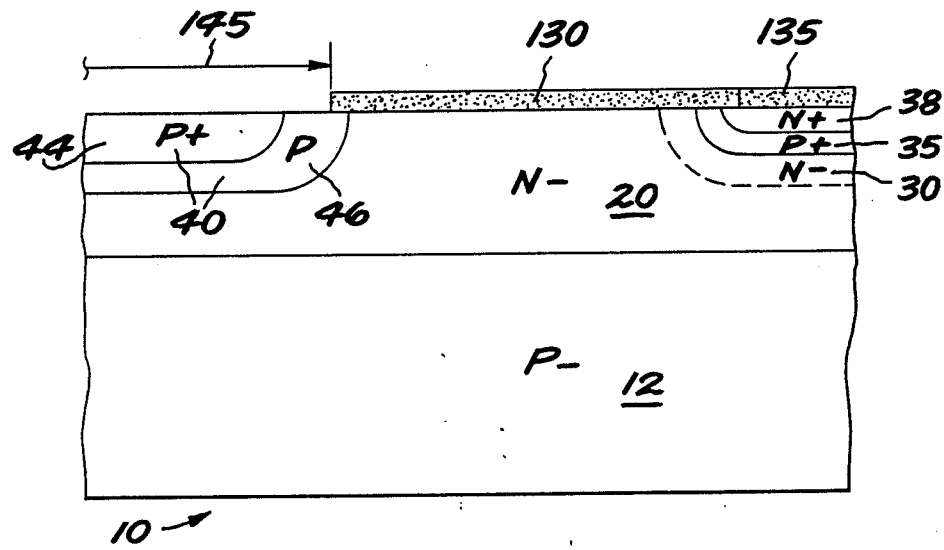
FIG. 5E B-B

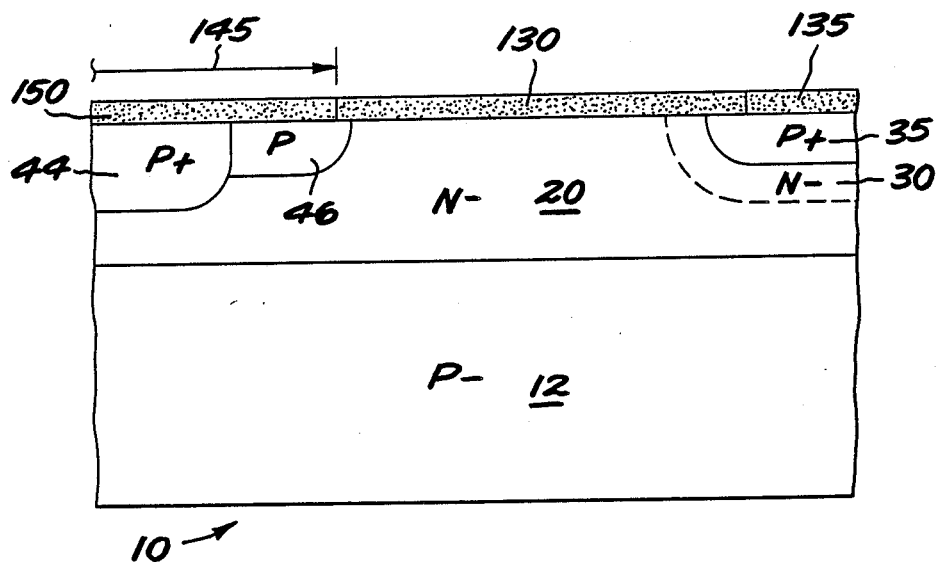
FIG. 5F A-A
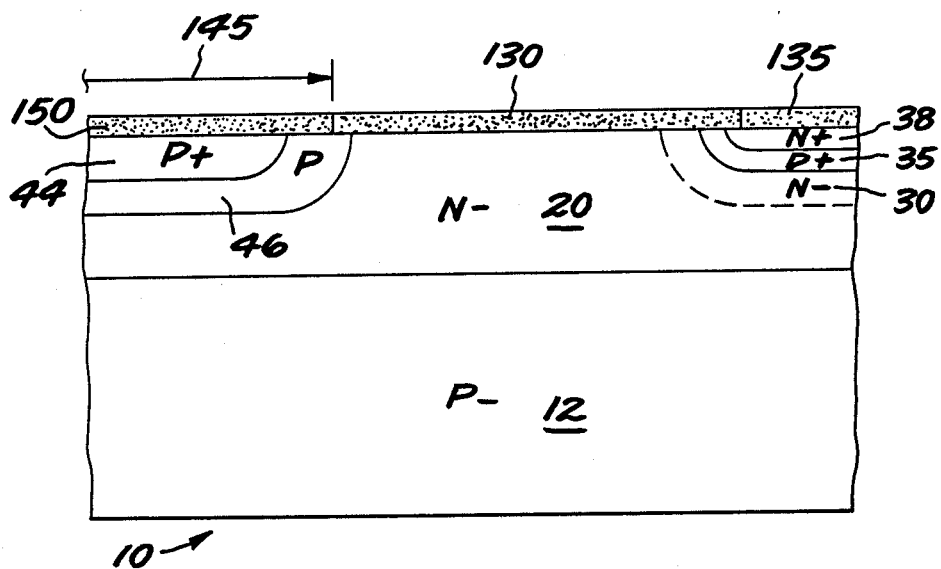
FIG. 5F B-B

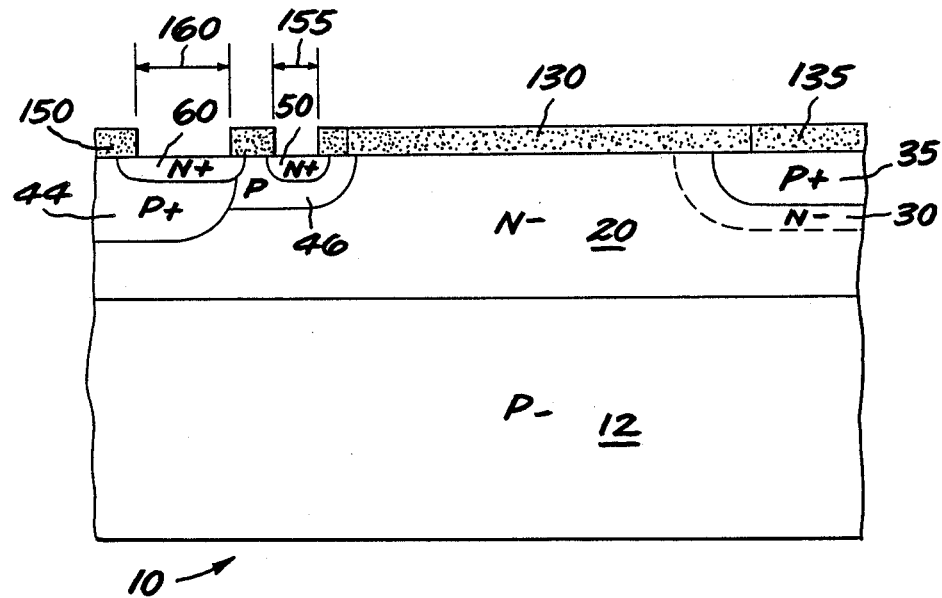
FIG. 5G A-A
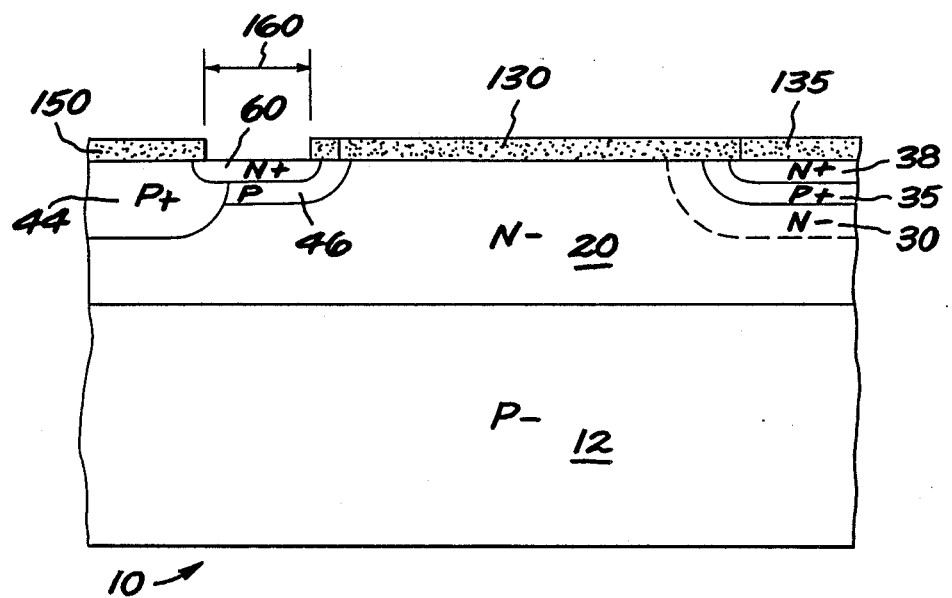
FIG. 5G B-B

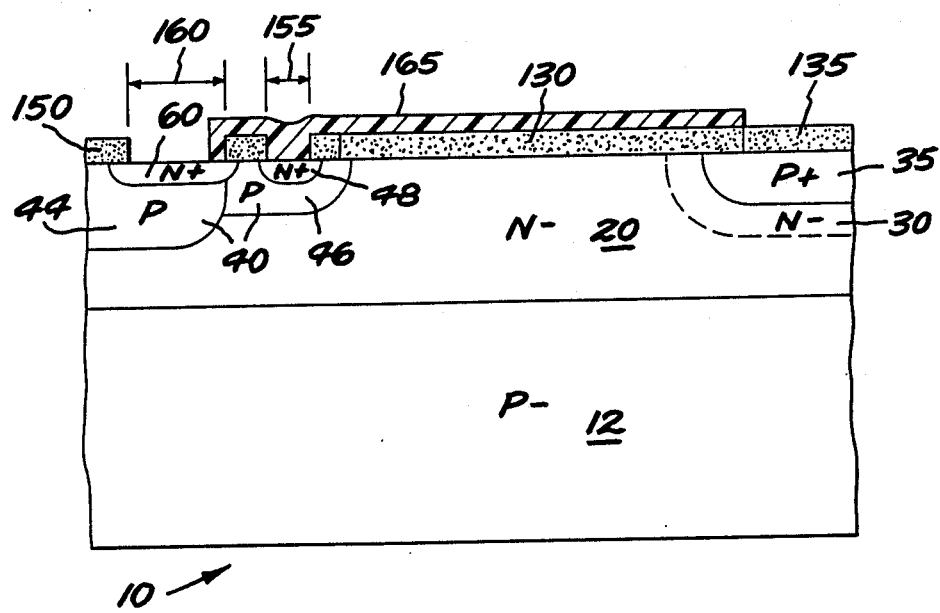
FIG. 5H A-A
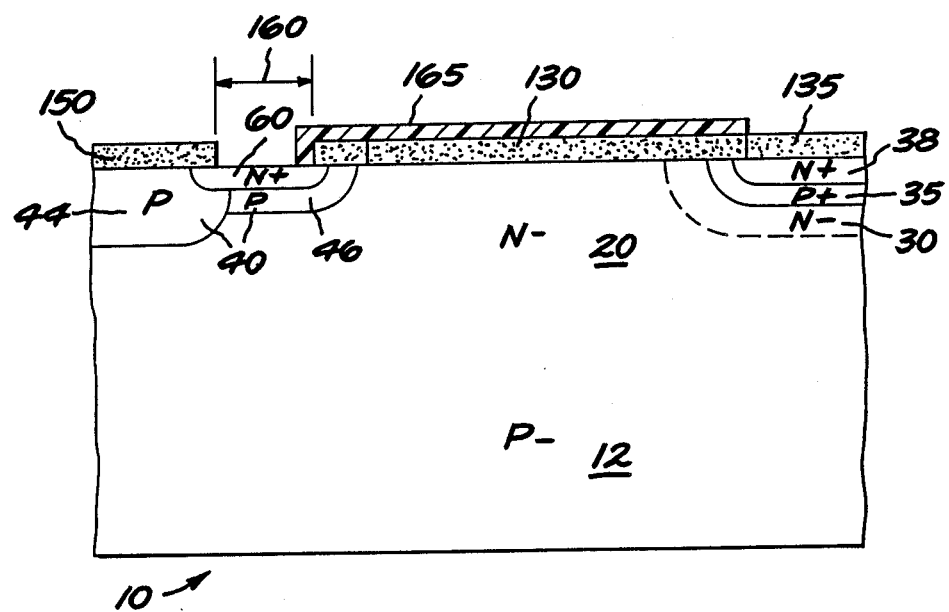
FIG. 5H B-B

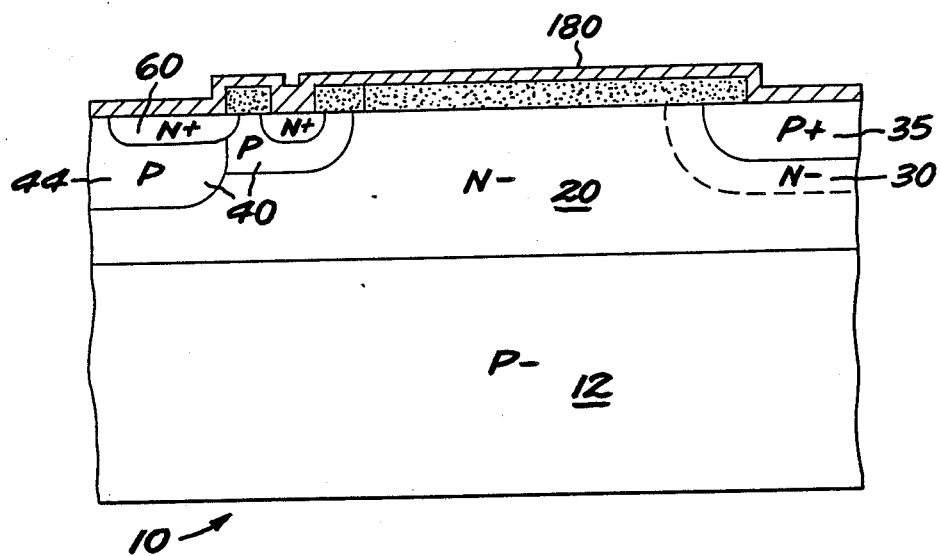
FIG. 51 A-A
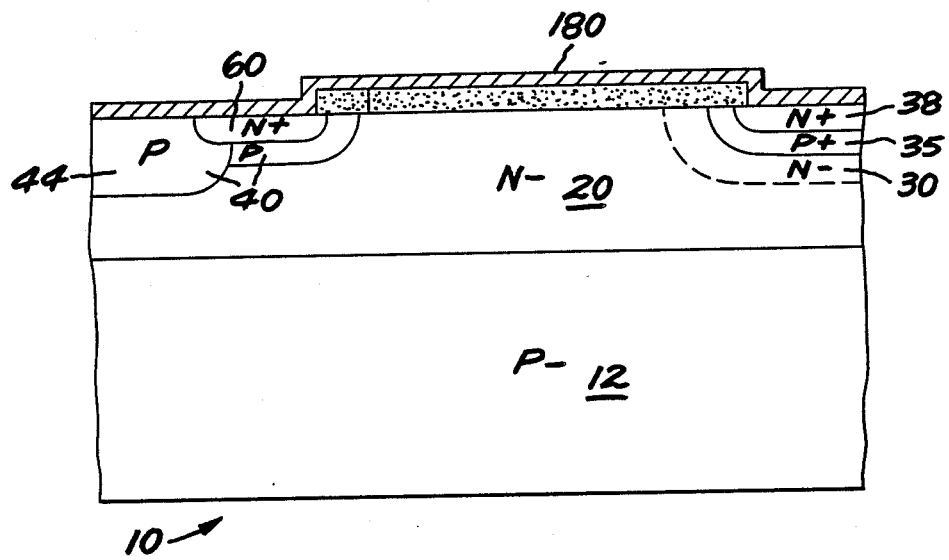
FIG. 51 B-B

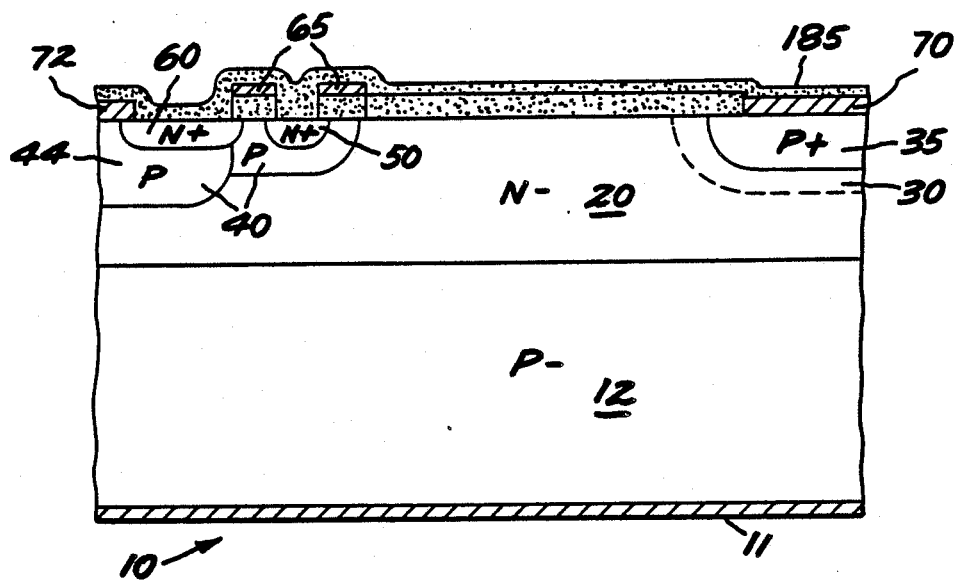
FIG. 5J A-A
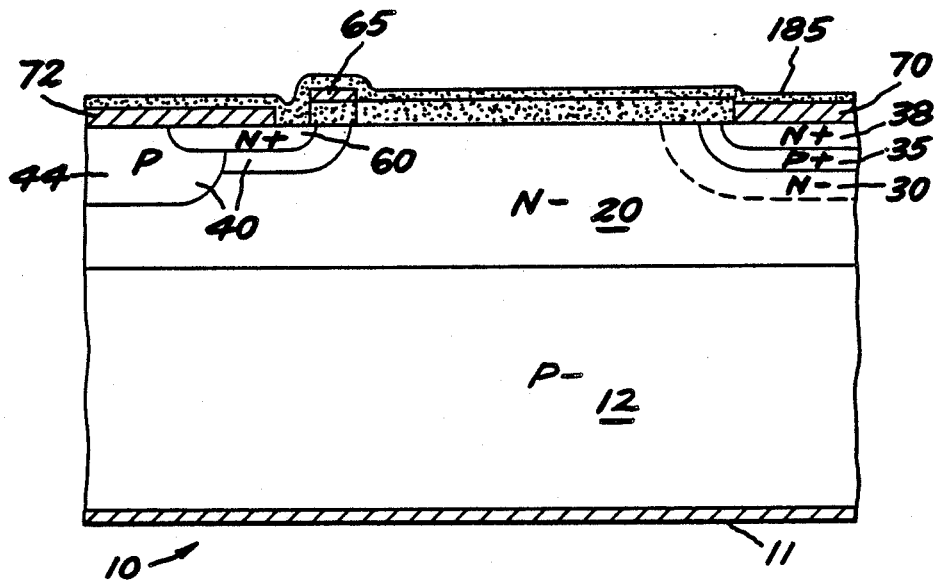
FIG. 5J B-B

MONOLITHICALLY INTEGRATED BIDIRECTIONAL LATERAL SEMICONDUCTOR DEVICE WITH INSULATED GATE CONTROL IN BOTH DIRECTIONS AND METHOD OF FABRICATION

This application relates to lateral insulated gate semiconductor devices and more particularly to monolithically integrated lateral semiconductor devices having a bidirection conducting capability with insulated gate control in both directions of current flow. More particularly, a semiconductor device in accordance with the present invention employs a first active portion such as an inherent thyristor to drive a second active portion comprising a three layer structure such as an inherent bipolar transistor. A single control signal applied to a single insulated gate controls all operating modes of the composite device.

RELATED APPLICATIONS

This application is related to U.S. patent application Ser. No. 051,424 for a "Monolithically Integrated Insulated Gate Semiconductor Device", U.S. Pat. application Ser. No. 051,427 for a "Monolithically Integrated Lateral Insulated Gate Semiconductor Device"; U.S. patent application Ser. No. 051,359 for an "Improved Insulated Gate Semiconductor Device and Process for Fabrication"; U.S. patent application Ser. No. 051,430 for a "Monolithically Integrated Insulated Gate Semiconductor Device Having Reverse Conducting Capability and Process for Fabrication" each of which is filed concurrently herewith, assigned to the assignee hereof and expressly incorporated by reference herein.

BACKGROUND OF THE INVENTION

Lateral insulated gate control transistors have been proposed in which an insulated gate is used to control the forward conductance of an inherent bipolar transistor. These prior devices have not provided for reverse conduction.

Further, prior MOS controlled TRIACs with gate turn-off capability have relied upon the use of two separate MOS gates to turn the device off. Each of the gates is separately referenced to a respective output terminal. These devices thus require the use of a very thick gate oxide such as suggested by Plummer et al. "Institute of Electrical and Electronic Engineers Transactions on Electron Devices", Vol. 27, pages 380-394 (1980) or alternatively require the use of high voltage level shifting circuits in combination with these devices. Both these features are undesirable. There thus exists an unfulfilled need to provide a lateral insulated gate device structure which provides for low voltage, high current forward and reverse conduction and which can be turned off by a single MOS controlled turn-off gate.

OBJECTS OF THE INVENTION

A principal object of the present invention is to provide an improved lateral insulated gate semiconductor device having a lateral MOS controlled device structure providing for both forward and reverse conduction with low voltage drops and high current densities.

An additional object of the present invention is to provide a lateral insulated gate semiconductor device comprising a monolithically integrated combination of as a first active portion of the device such as an inherent thyristor and a three layer structure such as an inherent bipolar transistor wherein the active portion of the device can be decoupled from the cathode electrode by a single insulated gate to turn the device off.

A further object of the present invention is to provide a lateral insulated gate semiconductor device which exhibits improved current density and improved immunity to latch up.

A still further object of the present invention is to provide a semiconductor device which includes an active device portion proximate an inherent transistor portion to thereby cause the active device portion to modulate the conductivity of the base of the transistor to establish a high current density in the base of the transistor portion to reduce the series resistance of the transistor portion by further increasing its conductivity modulation.

SUMMARY OF THE INVENTION

These and other objects and features of the present invention are achieved in a monolithically integrated lateral insulated gate semiconductor device having forward and reverse conducting capabilities comprising a body of semiconductor material including a first layer of one type semiconductor material and a second layer of opposite type conductivity semiconductor material. The first layer, while not critical to the operation of the device, facilitates the achievement of a structured electric field through the application of reduced surface field techniques. The second layer can be a lightly doped voltage supporting layer and can have a first region of opposite type conductivity disposed within the second layer to prevent punchthrough breakdown. A second region of one type conductivity is disposed within the second layer and preferably, within the first region, and forms a PN junction therewith. A third region of opposite type conductivity is disposed within a portion of the second region and forms a PN junction therewith. The third region is preferably heavily doped and a first electrode makes ohmic contact with the second and third regions.

A fourth region of one type conductivity is disposed within the second layer in opposed relation to the first, second and third regions. The fourth region also forms a PN junction with the second layer. A first surface portion of the fourth region can be heavily doped to provide an ohmic contact surface region. A second portion of the fourth region can be moderately doped and separate the second layer from the first portion. Fifth and sixth regions of opposite type conductivity are disposed within the fourth region and preferably form PN junctions therewith. The fifth region is disposed within the second portion of the fourth region. The sixth region, in a first portion, is disposed within the first portion of the fourth region and the sixth region in a second portion is disposed within a second portion of the fourth region. The second electrode makes ohmic contact with the sixth region and the first portions of the fourth region.

A unique insulated gate structure is provided wherein a first portion of the insulated gate is disposed over a portion of the fourth region intervening between the fifth region and the second layer and a second portion of the insulated gate region is disposed over another portion of the fourth region intervening between the fifth and sixth regions. In a preferred embodiment, the first and second portions of the insulated gate are directly electrically connected and coupled by, for instance, a metal strip. When the first and second portions of tee insulated gate are appropriately biased, a channel is established coupling the second layer through the fourth region to the fifth region and through the second channel to the sixth region and the second electrode. The junction between the fourth and fifth regions becomes forward biased as a result of the current carriers flowing through the fourth region, which are injected by the second region. A four layer structure such as an inherent thyristor comprising the second region, first region, second layer, fourth region and fifth region becomes forward biased when the voltage potential applied to the first electrode is more positive than that applied to the second electrode. In addition, the inherent bipolar transistor comprising the second region, first region, second layer and fourth region is fully turned-on inasmuch as the conduction in the four layer structure increases the carrier concentration of the base region of the inherent bipolar transistor and causes the inherent bipolar transistor to turn fully on. Accordingly, in the forward direction, the lateral insulated gate semiconductor device exhibits improved conductivity. Forward conduction can be terminated by allowing the insulated gate to float or alternatively, reversing the bias applied thereto to decouple the fifth and sixth regions and to decouple the fifth region and the second layer.

When the bias applied to the first electrode is more negative than that applied to the second electrode, conduction occurs in the reverse direction through a four layer structure comprising the fourth region, second layer, first, second and third regions. More particularly, in response to an appropriate bias applied to the first insulated gate, carriers flow from the first electrode via the sixth region, a channel in the fourth region, the fifth region and a second channel in the fourth region into the second layer. This short circuits the junction between the fourth region and the second layer inhibiting injection of minority carriers into the second layer and results in interruption of the regenerative current flow. This allows insulated gate controlled turn off of the reverse current flow.

A method of fabricating a semiconductor device in accordance with the present invention includes the following steps. Initially, a partially processed piece of semiconductor material comprising a first heavily doped layer of one type conductivity with a second lightly doped layer of opposite type conductivity disposed atop the first layer is provided. Thereafter, a first or buffer region of opposite type conductivity is established in the lightly doped second layer. A second region of one type conductivity is disposed within the first region and the second region forms a PN junction with the first region. A third region of opposite type conductivity is disposed within the second region and forms a PN junction therewith. A first electrode makes ohmic contact to the third region.

A fourth region of on type conductivity is also disposed within the second layer and in opposed relation to the first, second and third regions. The fourth region preferably comprises a first heavily doped portion and a second moderately doped portion. Fifth and sixth regions of opposite type conductivity are also disposed within the fourth region and form PN junctions therewith. A first portion of an insulated gate is disposed over a portion of the fourth region intervening between the fifth region and the second layer. A second portion of the insulated gate is disposed over a portion of the fourth region intervening between the fifth and sixth regions. A second electrode is disposed on ohmic contact with the fourth and fifth region.

The present invention thus provides a semiconductor device which exhibits improved conductivity and a method for fabricating that device. More particularly, the disclosed structure provides a lateral insulated gate control structure which provides for fully turned-on conduction in both the forward and reverse directions. Thus, the disclosed device can be operated with increased current density. Moreover, a single insulated gate, in response to an appropriate bias, turns the gate of.

BRIEF DESCRIPTION OF THE DRAWINGS

The features of the invention which are believed to be novel are specified with particularity in the appended claims. The invention itself, both as to organization and method of operation, together with additional features, objects and advantages of the monolithically integrated bidirectional lateral insulated gate semiconductor device of the present inventinn can be best understood by reference to the following detailed description when considered in conjunction with the accompanying drawings in which:

FIG. 1 is a cross-sectional illustration of a conventional MOS controlled TRIAC;

FIG. 2 is cross-sectional illustration of a portion of a single cell of a monolithically integrated bidirectional lateral insulated gate semiconductor device in accordance with the present invention and taken along lines A—A of the FIG. 4;

FIGS. 5A–5J are illustrations of a cross-section of a monolithically integrated reverse conducting lateral insulated gate semiconductor device during successive steps performed in the process of fabricating the device.

DETAILED DESCRIPTION OF THE PREFERRED EMBODIMENTS

Figure 3:
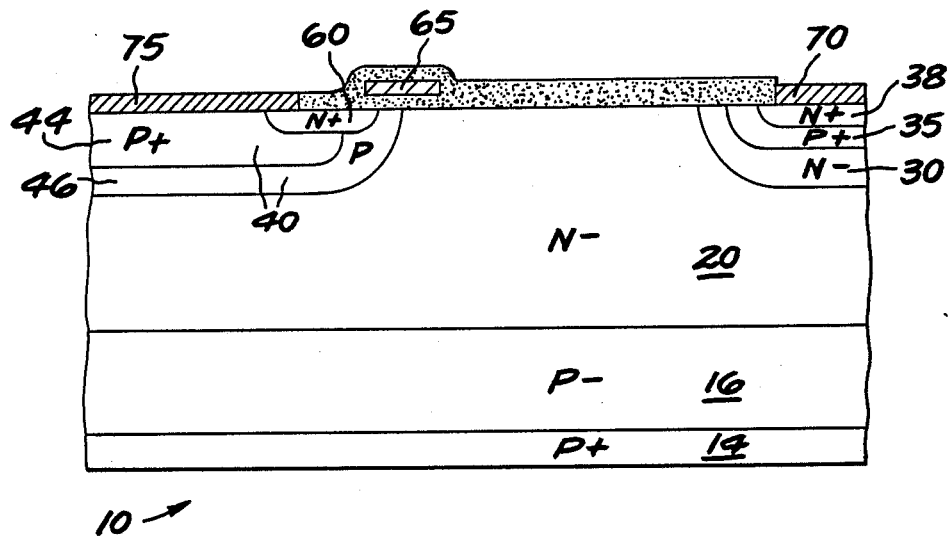
FIG. 3 is a cross-sectional illustration of a portion of a single cell of a monolithically integrated bidirectional lateral insulated gate semiconductor device in accordance with the present invention and taken along lines B—B in FIG. 4.

The monolithically integrated bidirectional lateral insulated gate semiconductor device of the present invention is applicable to a broad range of semiconductor devices and can be fabricated from a variety of semiconductor materials. The ensuing description will disclose several preferred embodiments of the monolithically integrated semiconductor device of the present invention as implemented in silicon substrates because devices fabricated in silicon substrates make up an overwhelming majority of the currently available semiconductor devices. Consequently, the most commonly encountered applications of the present invention will involve silicon substrate devices. Nevertheless, it is intended that the invention disclosed herein can be advantageously employed in gallium arsenide, germanium and other semiconductor materials. Accordingly, application of the present invention is not intended to be limited to those devices fabricated in silicon semiconductor materials, but will encompass those devices fabricated in any of a number of semiconductor materials.

Moreover, while the present invention discusses a number of preferred embodiments directed to silicon semiconductor devices, it is intended that these disclosures be considered as illustrative examples of the preferred embodiments of the present invention and not as a limitation on the scope or applicability of the present invention. Further, while the illustrated examples disclose the bidirectional lateral insulated gate semiconductor device in connection with insulated gate control structures, it is recognized that the insulated gate or portions thereof can be replaced with a light activated or current activated structure(s). Thus, it is not intended that the monolithically integrated bidirectional lateral insulated gate semiconductor device of the present invention be limited to the structures illustrated. These devices are included to demonstrate the utility and application of the present invention to what are considered preferred commercial embodiments.

Given the relationship of FIGS. 2-5, corresponding parts have been designated with the same reference numeral as an aid to understanding the description of the invention. Various parts of the semiconductor elements, however, have not been drawn to scale. Certain dimensions have been exaggerated in relation to other dimensions in order to present a clearer illustration and understanding of the present invention. Although for the purposes of illustration, the preferred embodiment of the monolithically integrated bidirectional lateral insulated gated semiconductor device of the present invention has been shown to include specific P and N type regions, it is understood that the teachings herein are equally applicable to monolithically integrated lateral insulated gate semiconductor devices in which the the conductivities of the various regions have been reversed, for instance, to provide the dual of the illustrated device. Enhancement and depletion mode structures can be similarly interchanged.

Further, although the embodiments illustrated herein are shown in two dimensional views with various regions having width an depth, it is understood that these regions are illustrations of only a portion of a single cell of a device comprised of a plurality of cells arranged in a three-dimensional structure. Accordingly, these region, when fabricated in actual devices, will have three dimensions including length, width and depth.

Figure 4:
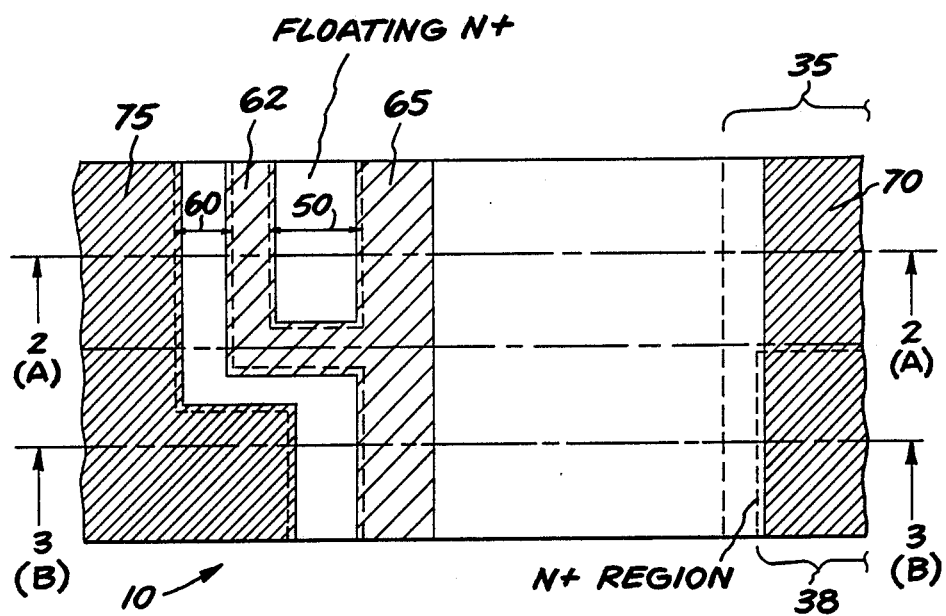
FIG. 4 is a top view of a portion of a single cell of a monolithically integrated bidirectional lateral insulated gate semiconductor device such as that shown in FIGS. 3 and 4.

Referring now to FIGS. 2-4 in combination, a preferred embodiment of the present invention as applied to a monolithically integrated bidirectional lateral insulated gate semiconductor device generally designated 10, comprising a plurality of inherent active insulated gate structures is shown. More particularly, a portion of a single cell of an insulated gate semiconductor device comprising a lateral transistor driven by an inherent thyristor structure is shown. The devices, as illustrated, can be symmetric about an axis through the right or left hand portion of the illustration.

The semiconductor device 10, in accordance with the present invention, is shown to comprise first layer 12 of one type conductivity which is shown as a P type conductivity layer. The first layer can include a heavily doped first surface portion 14 to facilitate the establishment of an ohmic contact to the first layer 12. A second layer 20 of opposite type conductivity is disposed atop the first layer and forms a pN junction therewith. The second layer 20 is illustrated as a lightly doped N type conductivity layer. In establishing the first and second layers 12 and 20, respectively, either the first or second layer can be deposited on the other layer by epitial growth, or alternatively, can be established within the other layer by diffusion or implantation techniques.

A portion of the second layer 20 comprises a first portion of the second surface 25 of the device 10. A first region 30 comprising opposite type conductivity semiconductor material is established within the second layer 20 and is shown to provide an N type buffer region between the second layer 20 and a subsequently established second region 35. The second region 35 comprises one type conductivity material and is disposed within the second region 30 if it is present and forms a PN junction therewith. As illustrated, the second region 35 comprises a moderately doped P type conductivity material which is disposed entirely within the first region 30.

A third region 38, shown in FIGS. 3 and 4, is of opposite type conductivity and is also disposed within the second region and forms a PN junction therewith. It is preferred that the third region 38 be heavily doped and form a portion of the second surface 25 of the semiconductor device 10. Further, as shown in FIG. 4, the third region 38 is not coextensive with the second region 35, but is established with only a portion of the second region 35.

A fourth region 40 of one type conductivity is disposed within the second layer 20 and forms a PN junction 42 therewith. As illustrated, the fourth region 40 comprises a first heavily doped portion 44 and a second more lightly doped portion 46. As illustrated, the fourth region 40 comprises P type conductivity material and also comprises a portion of the first surface 25 of the device 10. As shown in FIG. 2, the first portion 44 comprises a minor portion of the fourth region 40, while the second portion 46 comprises a major portion of the fourth region 40. However, as shown in FIG. 3, the first portion 44 of the fourth region 40 comprises a major portion of the fourth region 40, while the second portion 46 of the fourth region 40 comprises only a minor portion of the fourth region 40. The functional significance of this particular arrangement of the fourth region will be explained in the operational portion discussed below.

Fifth and sixth regions 50 and 60, respectively, comprising opposite type conductivity material are disposed within the fourth region 40. The fifth and sixth regions 50 and 60, respectively, comprise heavily doped N type conductivity material and are discrete from each other and a portion of the fourth region is disposed therebetween. As illustrated in FIG. 2, the fifth region is disposed only within the second more lightly doped portion of the fourth region 40. The sixth region 60, as shown in FIGS. 2-4, is disposed within the first and second portions 44 and 46, respectively, of the fourth region 40. The fifth region 50, in combination with the second layer 20, defines a first channel portion of the fourth region 40. The fifth and sixth regions 50 and 60, respectively, in combination, define a second channel portion of the fourth region 40 disposed therebetween.

A first insulated gate structure 65 is disposed over the first channel portion of the fourth region 40 and a second insulated gate structure 62 is disposed over the second channel portion of the fourth region 40. In a preferred embodiment, the insulated gate structure 65 can comprise an insulation layer 67 situated atop the fist surface 25 and a gate layer 69 situated atop the insulation layer 69. The gate layer 69, as shown in FIGS. 2 and 4, extends over the channel portion of the fourth region 40 situated between the fifth and sixth regions 50 and 60. The gate layer 69 extends preferably over a portion of the fifth and sixth regions 50 and 60, respectively, as well as a portion of the second layer 20.

A first electrode 70 is disposed in ohmic electric contact with the second and third regions 35 and 38, respectively. A second electrode 75 is disposed in ohmic contact with the fourth and sixth regions 40 and 60, respectively. Once the insulated gates 6 and 65 are appropriately biased, an electron flow is established from the second electrode through the sixth, fourth fifth and fourth 60 regions 40, 50 and 40, respectively, into the second layer 20. The voltage drop established by this electron flow is sufficient to forward bias the junction between the first and second regions 30 and 35, respectively, establishing regenerative conduction in the four layer structure comprising the second region, first region, second layer, fourth region and fifth region 35, 30, 20, 40 and 50, respectively. Once the lateral four layer structure has been activated, a sufficient current flow is provided within the second layer 20 of the device 10 to increase the carrier concentration within the base region of the inherent bipolar transistor to cause this to activate. More particularly, the lateral inherent bipolar transistor comprising the second region 35, the first region 30, the second layer 20 and the fourth region 40 is activated providing lateral conduction between the first and second electrodes. Conduction in the four layer structure ca be maintained only so long as the insulated gate is appropriately biased to couple the regions together. When the bias is removed or reversed, conduction ceases and the device turns off.

Referring now to FIG. 3, when the bias applied to the first and second electrodes is reversed, the bias applied to the second electrode is more positive than that applied to the first. A five layer structure (N−, P+, N, N−, P) comprising the third region, second region, first region, second layer and fourth region 38, 35, 30, 20 and 40, respectively, is turned on by traditional means, i.e., by a conventional gate or a MOS gate to establish regenerative conduction in the reverse direction. By application of an appropriate bias to the gate electrode 65, an MOS channel is formed, shorting the anode 40 to the base region 20 while suppressing injection from the anode, leading to turn off of the current conduction.

Accordingly, the monolithically integrated lateral insulated gate semiconductor device of the present invention conducts current in both the forward and reverse directions which can be turned off in response to an appropriate bias applied to the insulated gate structure.

Figure 5A:
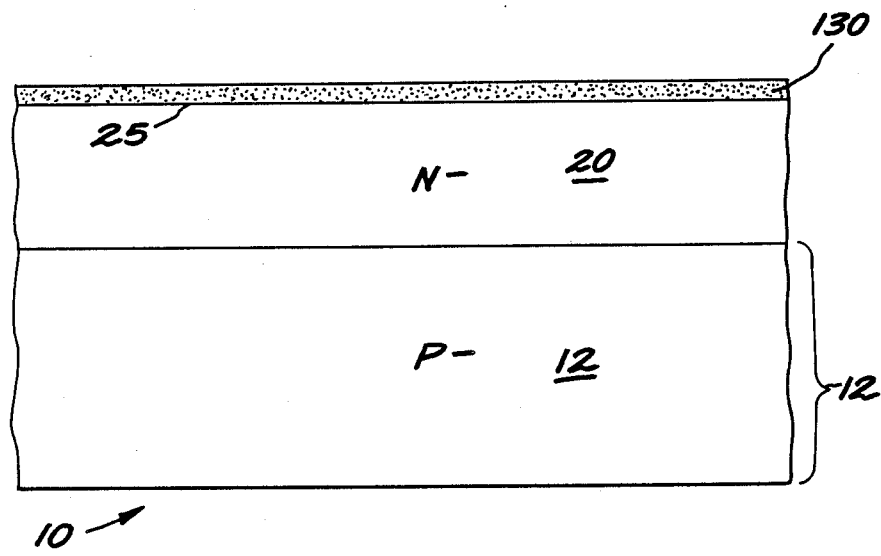

A method of fabricating the monolithically integrated first conducting lateral insulated gate semiconductor device of the present invention as illustrated in FIGS. 5A–5H comprise the following steps. Referring now to FIG. 5A, initially, a body of semiconductor material including a first layer 12 of one type conductivity and a second layer 20 of opposite type conductivity is provided. In the illustrated embodiment, the first layer 12 is shown to comprise P type conductivity semiconductor material.

A second layer 20 is provide atop the first layer 12. The second layer 20 can be established by epitaxial growth techniques or doping techniques such as implantation and diffusion techniques. The second layer 20 is illustrated to comprise a lightly doped opposite type conductivity layer shown as an N type conductivity layer. Thereafter, a first protective layer 130, such as an oxide layer, is disposed atop the first surface 25 of the second layer 20.

A first window 132 shown in FIG. 5B is opened through the first protective layer 130 and a moderately doped opposite type conductivity first region 30 is established therein by providing a high energy implantation of opposite type conductivity determining ions into the second layer 20 and then driving them to a sufficient depth to establish a puffer region 30 between the second layer 20 and the second region 35. Thereafter, a second doping is made through the same first window 132 to establish a second region 35 of one type conductivity shown as a P type region. A photoresist mask is provided to cover all of region 35 except for that portion shown as region 38 in FIG. 4. Thereafter, a third doping with opposite type conductivity ions is implanted through the window 132 which has been modified as stated to establish a third region 38 of opposite type conductivity within the second region 35.

Thereafter, a second protective layer 135 is disposed within the first window 132 and a second window 140 shown in FIG. 5D is opened through the first protective layer 130. A heavy concentration of one type conductivity impurities is implanted through the second window 140 into the second layer 20 to establish a first portion 44 of the fourth region 40. As shown by comparing FIGS. 5D A—A with 5D B—B, the fourth region 40 is specially configured to include a large portion 44 in opposed relation to the third region 38 and a small portion 44 otherwise.

A larger window 145 is then opened in the location of window 140 as shown in FIG. 5E. A further supply of P type dopant is introduced through window 145 to form the P region 46.

Thereafter, a third protective layer such as an insulation layer 150 shown in FIGS. 5F is disposed on the first surface 25 within the third window 145. Subsequently, as shown in FIG. 5G, the insulation layer 150 is pattern using photolithographic techniques to open fourth and fifth windows 155 and 160, respectively, therethrough. The fourth window 155 is substantially linear and exposes a portion of the first and second portions 44 and 46 of the fourth region 40 as shown in FIG. 5G and extends over a fifth region 50. The fifth window 160 extends over the sixth region 60. The fourth and fifth windows are separated from each other by the insulation layer 150.

Subsequently, a heavy concentration of opposite type conductivity impurities, such as N type impurities, are implanted through the fourth and fifth windows 155 and 160, respectively, and are driven to establish fifth and sixth regions 50 and 60, respectively. Subsequently, as shown in FIG. 5H, a fourth protective layer such as a photoresist layer 165 is disposed atop the first and third insulation layers 130 and 150. Thereafter, the exposed portions of the first and third protective layers are removed and a portion of the second, third, fourth and sixth regions 35, 38, 40 and 60 are exposed. Thereafter, as shown in FIG. 5I, a metallization layer 180 is deposited on the exposed surface of the device and patterned using photolithographic techniques. More articularly, as shown in FIG. 5J, a first electrode 70 is disposed in ohmic contact with the second and third regions 35 and 38, respectively and a second electrode 72 is disposed in ohmic contact with the fourth and sixth regions 40 and 60, respectively. Thereafter, the passivation layer 185 is applied to the upper surface.

It is to be recognized that while the preferred embodiments of the present invention have been disclosed with respect to a monolithically integrated bidirectional lateral insulated gate semiconductor device comprising transistors driven by a thyristor in the forward direction and a reverse direction, it should be recognized that the present invention is not so limited, but is equally applicable other monolithically integrated lateral semiconductor devices in which a first portion of the device is used to drive a second portion of the device. Numerous modifications and changes, variations and substitutions and equivalents will occur to those skilled in the art without departing from the true spirit and scope of the present invention. Accordingly, it is intended that the invention herein be limited only by the scope of the appended claims.

What is claimed is:

1. A monolithically integrated lateral insulated gate semiconductor device including:
    a body of semiconductor material having a substantially planar upper surface comprising:
        a first layer of semiconductor material,
        a first region disposed within said first layer and forming a portion of said upper surface of said device,
        a second region of one type conductivity disposed within said first region and forming ga portion of said upper surface, said first region being of opposite type conductivity,
        a third region of opposite type conductivity disposed within a portion of said second region and forming a portion of said upper surface,
        a fourth region of one type conductivity disposed within said first layer, spaced from said second region and forming a portion of said upper surface,
        a fifth region of opposite type conductivity disposed within said fourth region, forming a first PN junction with said fourth region and forming a portion of said upper surface, and
        a sixth region of opposite type conductivity, spaced from said fifth region, disposed within said fourth region, forming a second PN junction with said fourth region and forming a portion of said upper surface;
    an insulated gate electrode structure associated with a portion of said fourth region which is disposed between said fifth region and said first layer, said insulated gate electrode structure, in response to an appropriate bias voltage, rendering a channel portion of said fourth region coupling said fifth region to said first layer conductive to opposite type conductivity carriers;
    a first main electrode disposed on said upper surface in ohmic contact with said second and third regions; and
    a second main electrode spaced from said first main electrode and disposed on said upper surface in ohmic contact with said fourth and sixth region;
    said fifth region being spaced from said first and second electrodes and free of ohmic contacts thereto.

2. The semiconductor device of claim 1 wherein said insulated gate is disposed on said upper surface.

3. The semiconductor device of claim 1 wherein said insulated gate structure also extends over a portion of said fourth region disposed between said fifth and sixth regions, said insulated gate structure, in response to an appropriate bias voltage, rendering a channel portion of said fourth region coupling said fifth region to said sixth region conductive to opposite type conductivity carriers.

4. The semiconductor device of claim 1 further comprising a second insulated gate electrode structure associated with a portion of said fourth region which is disposed between said fifth and sixth regions, said second insulated gate electrode structure, in response to an appropriate bias voltage, rendering a second channel portion of said fourth region coupling said fifth region to said sixth region conductive to opposite type conductivity carriers.

5. The semiconductor device of claim 1 wherein said first layer is of opposite type conductivity.

6. The semiconductor device of claim 5 further including a second layer of one type conductivity disposed on said first layer on a side opposite said insulated gate electrode.

7. The semiconductor device of claim 1 wherein said insulated gate electrode structure extends over a portion of said fifth region and a portion of said sixth region and in response to an appropriate bias voltage, renders channel portions of said fourth region which extends between said fifth and sixth regions and between said fifth region and said first layer conductive to opposite type conductivity carriers, thereby coupling said first layer and said fifth and sixth regions.

8. The semiconductor device of claim 1 wherein said fourth region comprises a first heavily doped portion and a second lightly doped portion.

9. The semiconductor device of claim 1 wherein said second region has first and second portions and said third region is disposed in said first portion of said second region and spaced from said second portion of said second region.

10. The semiconductor device of claim 1 wherein:
    said second and fourth region are elongated in a first direction and spaced apart in a second direction perpendicular to said first direction;
    said third region is substantially shorter, in said first direction, than said second region;
    said fifth region is substantially shorter, in said first direction, than said fourth region 11. The semiconductor device of claim 10 wherein:
    said third and fifth regions are offset from each other in said first direction.

12. The semiconductor device of claim 11 wherein:
    a line may be drawn perpendicular to said first direction in a location where said third and fifth regions are disposed on opposite sides of said line and spaced from said line.

13. The semiconductor device recited in claim 1 wherein:
    said second region is free of gate controlled channels.

* * * * *